United States Patent [19]

Fujii et al.

[11] Patent Number: 5,470,771
[45] Date of Patent: Nov. 28, 1995

[54] METHOD OF MANUFACTURING A FLOATING GATE MEMORY DEVICE

[75] Inventors: Tetsuo Fujii, Toyohashi; Minekazu Sakai, Aichi; Akira Kuroyanagi, Okazaki, all of Japan

[73] Assignee: Nippondenso Co., Ltd., Aichi, Japan

[21] Appl. No.: 658,773

[22] Filed: Feb. 21, 1991

Related U.S. Application Data

[62] Division of Ser. No. 344,605, Apr. 28, 1989, Pat. No. 5,017,979.

[51] Int. Cl.[6] .................... H01L 21/3215; H01L 21/8247
[52] U.S. Cl. ............................ 437/43; 437/978; 437/235; 437/241
[58] Field of Search ........................ 437/43, 241–243, 437/235, 920; 357/23.5; 148/DIG. 112

[56] References Cited

U.S. PATENT DOCUMENTS

| 4,688,078 | 8/1987 | Hseih | 357/23.5 |
|---|---|---|---|
| 4,764,248 | 8/1988 | Bhattacherjee et al. | 156/643 |
| 4,776,925 | 10/1988 | Fossum et al. | 437/34 |
| 4,778,776 | 10/1988 | Tong et al. | 437/228 |
| 4,812,898 | 3/1989 | Sumihiro | 357/23.5 |
| 4,894,353 | 1/1990 | Ibok | 437/43 |
| 4,958,321 | 9/1990 | Chang | 365/185 |
| 4,980,307 | 12/1990 | Ito et al. | 437/235 |

FOREIGN PATENT DOCUMENTS

| 0086372 | 1/1983 | European Pat. Off. | 357/23.5 |
|---|---|---|---|
| 58-93289 | 6/1983 | Japan | 437/52 |
| 0084868 | 4/1986 | Japan | 357/23.5 |
| 63-62382 | 3/1988 | Japan | 437/43 |
| 64-37027 | 2/1989 | Japan | |
| 218934 | 1/1990 | Japan | |
| 2150029 | 6/1990 | Japan | |
| 83/02199 | 6/1983 | WIPO | 357/23.5 |

OTHER PUBLICATIONS

Ghandhi "VLSI Fabrication Principles", 1983, pp. 425–431, John Wiley and Sons Publisher, New York.
Chen, "Threshold–Alternable Si–Gate MOS Device", IEEE Transactions on Electron Devices, vol. ED. 24. No. 5 May 1977, pp. 582–584.
Yau "Determination of the Fowler–Nordheim Tunneling Barrier from Nitride to Oxide in Oxide: Nitride Dual Dielectric", IEEE Electron Device Letters, vol. EDE–7, No. 6, Jun. 1986, pp. 365–367.
Jeng et al. "Properties of Thin Oxynitride Films used as Floating Gate Tunneling Dielectric (in $E^2$ PROM Cell)", International Electron Devices Meeting. Technique Digest New York, N.Y., USA: IEEE, 1982, pp. 811–812, pp. 6 Refs.

Primary Examiner—Olik Chaudhuri
Assistant Examiner—Richard A. Booth
Attorney, Agent, or Firm—Cushman, Darby & Cushman

[57] ABSTRACT

A gate oxide film is formed on a surface of a semiconductor substrate. A tunnel insulating film having a thickness smaller than that of the gate insulating film is formed in a portion thereof corresponding to a tunnel region. A first silicon film having a low impurity concentration is formed on the gate insulating film. A second silicon film having an impurity concentration higher than that of the first silicon film is formed on the first silicon film so as to be connected thereto. A third silicon film is formed on the second silicon film through an insulating film. The second and third silicon films are formed into floating and control gates, respectively, thereby forming a semiconductor memory device.

14 Claims, 17 Drawing Sheets

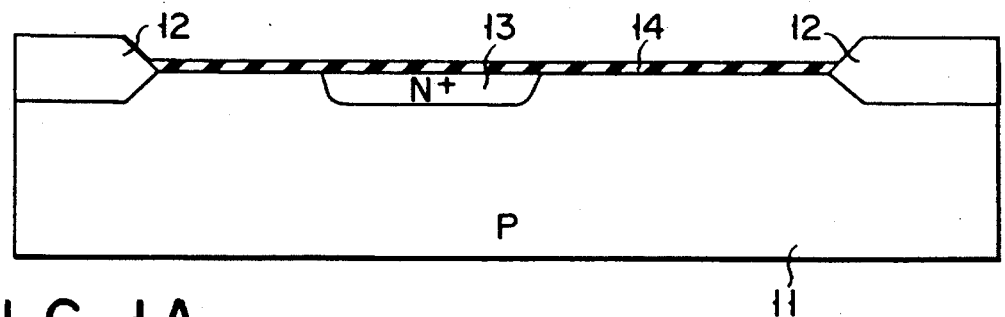
F I G. 1A
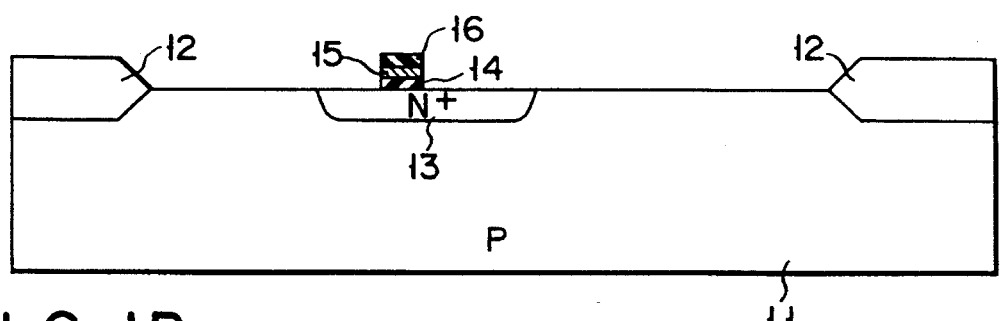
F I G. 1B
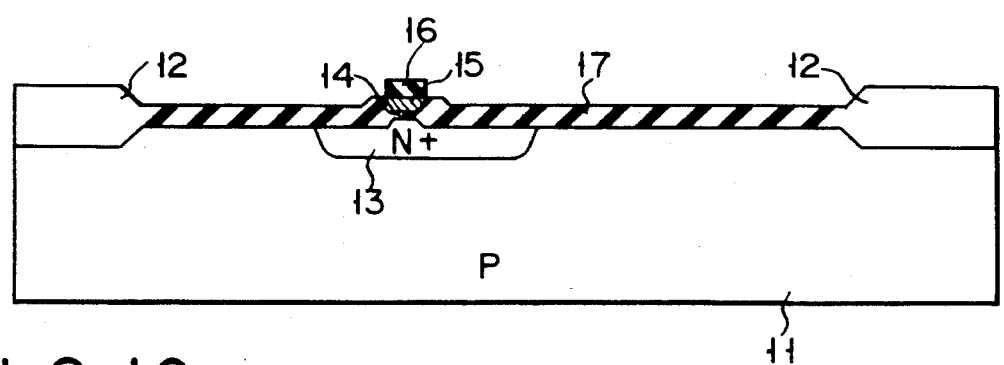
F I G. 1C
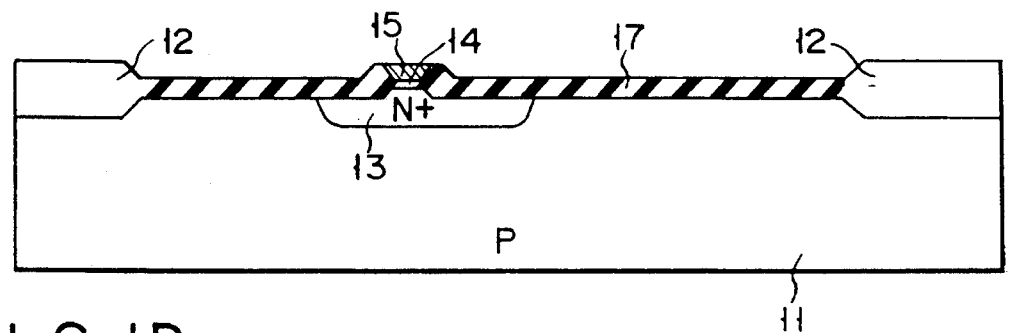
F I G. 1D

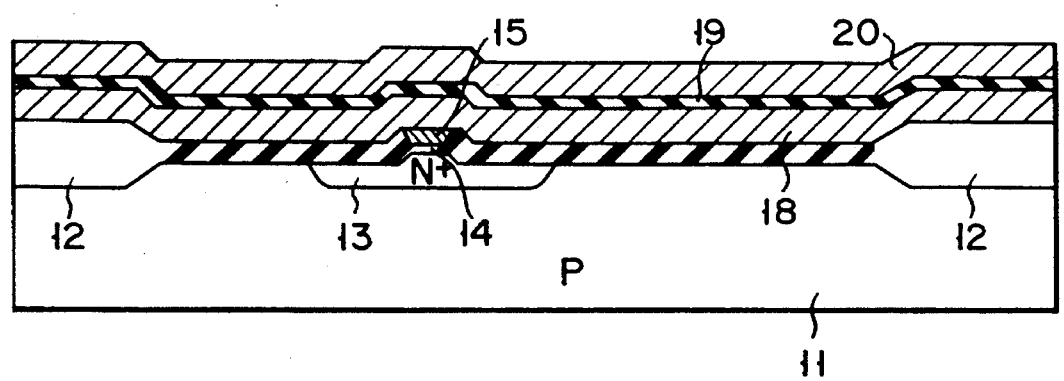
F I G. 1E
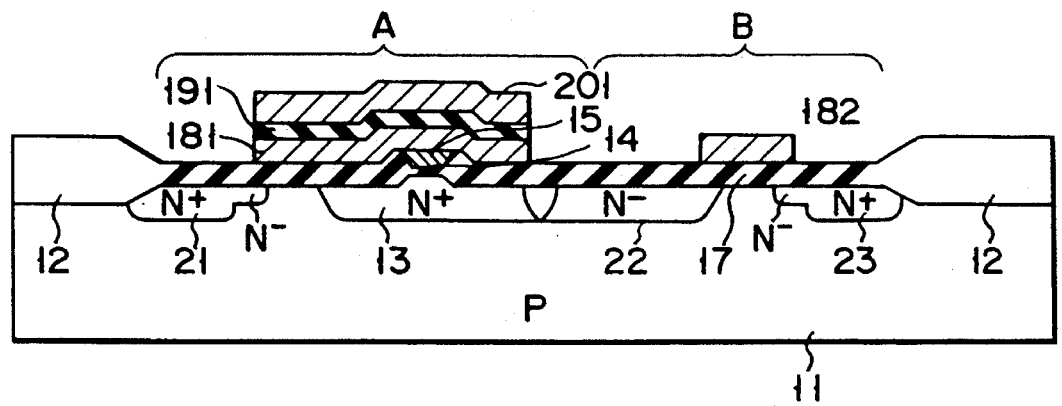
F I G. 1F
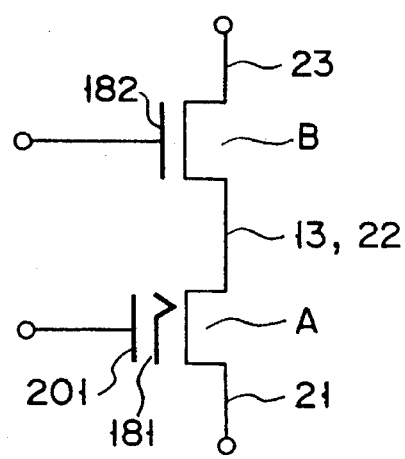
F I G. 2

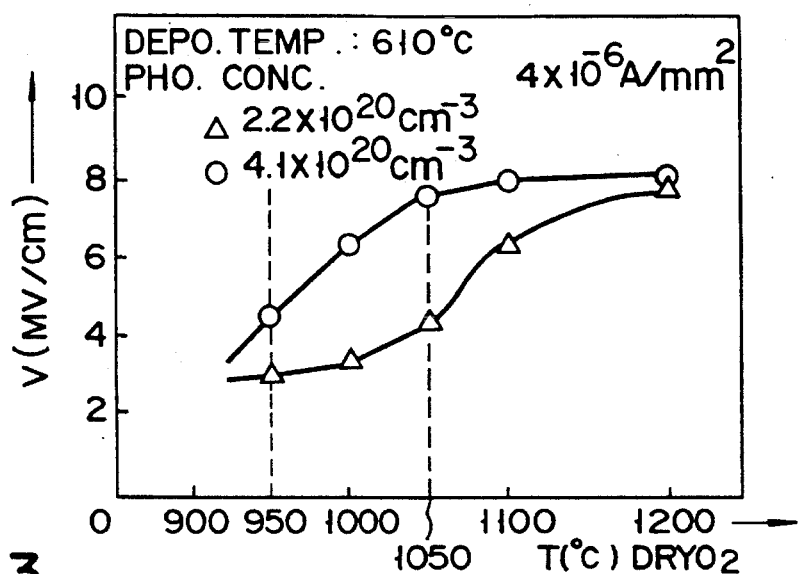
F I G. 3
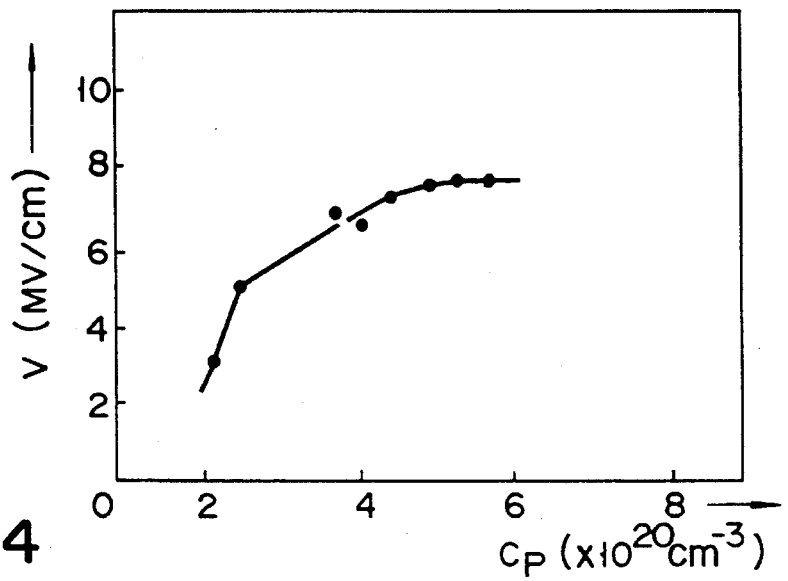
F I G. 4
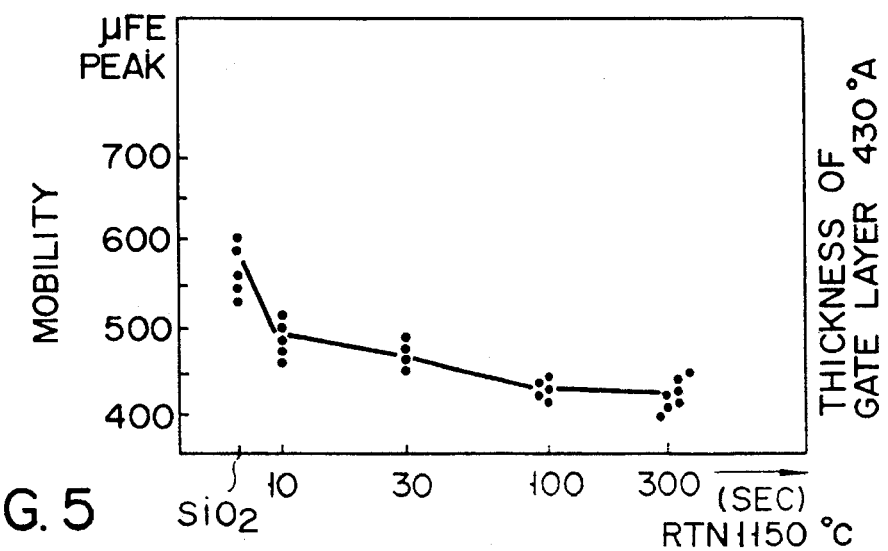
F I G. 5

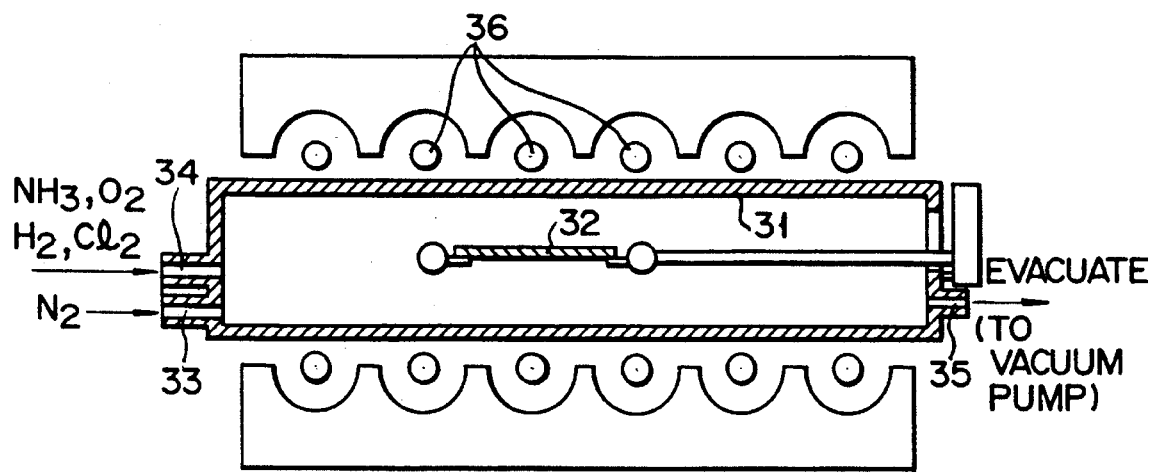
F I G. 6
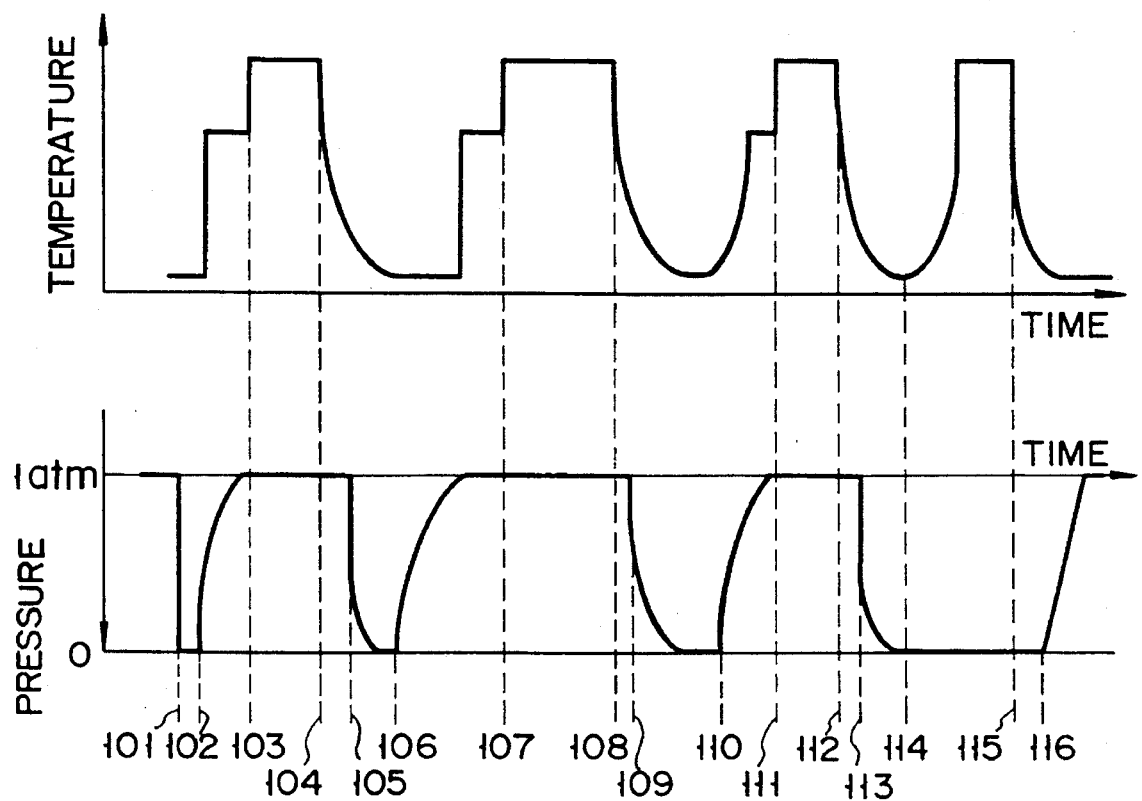
F I G. 8

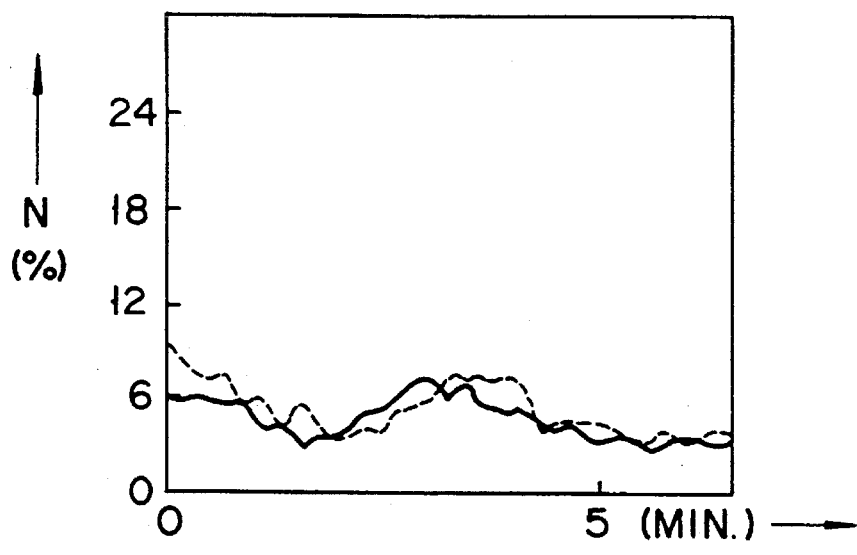
F I G. 12A
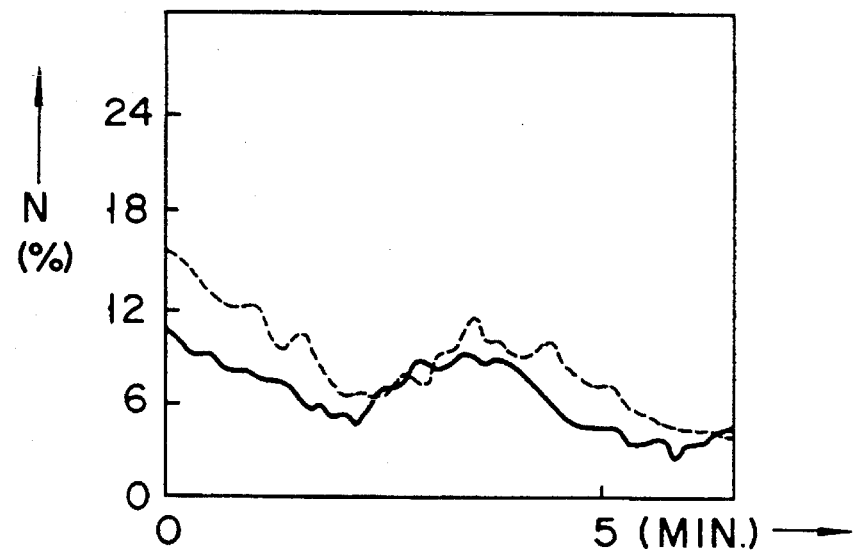
F I G. 12B

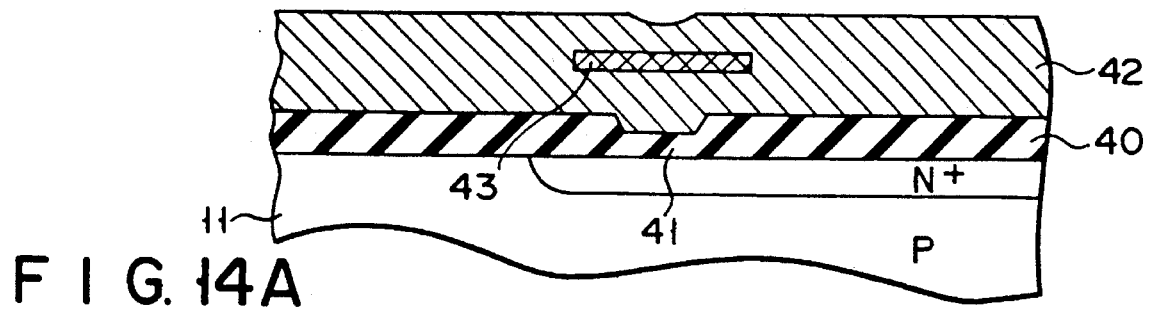
F I G. 14A
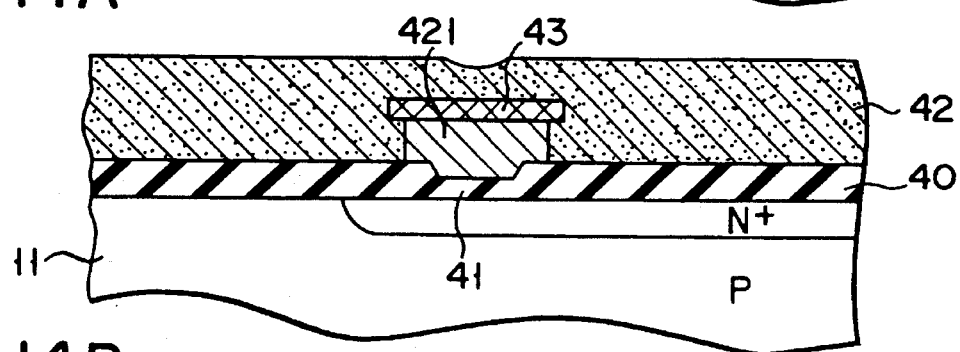
F I G. 14B
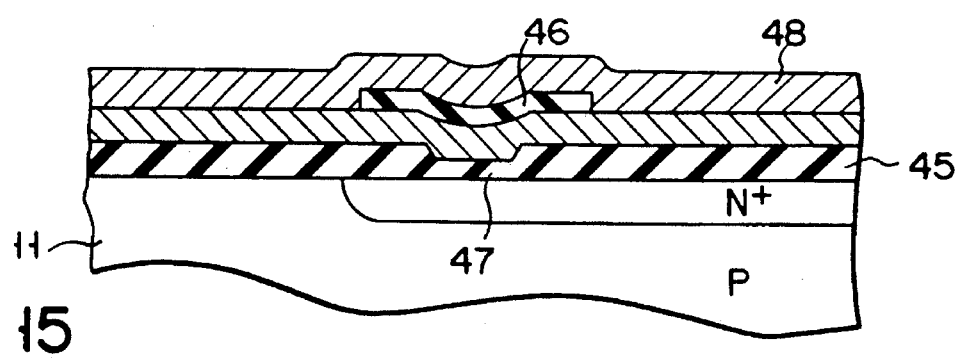
F I G. 15

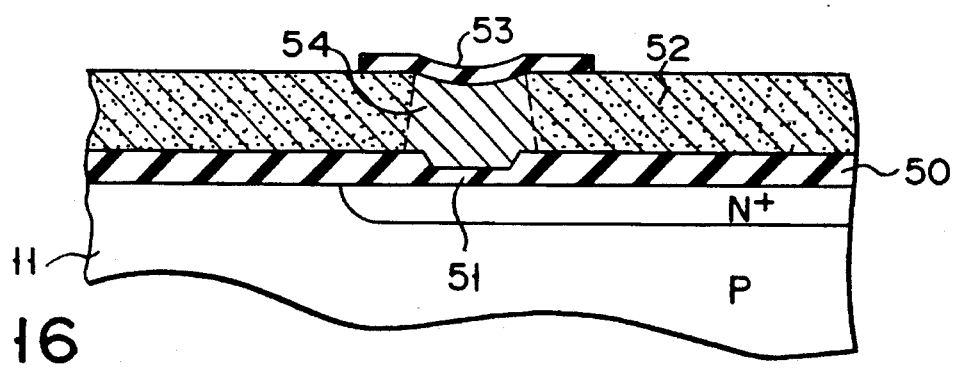
F I G. 16
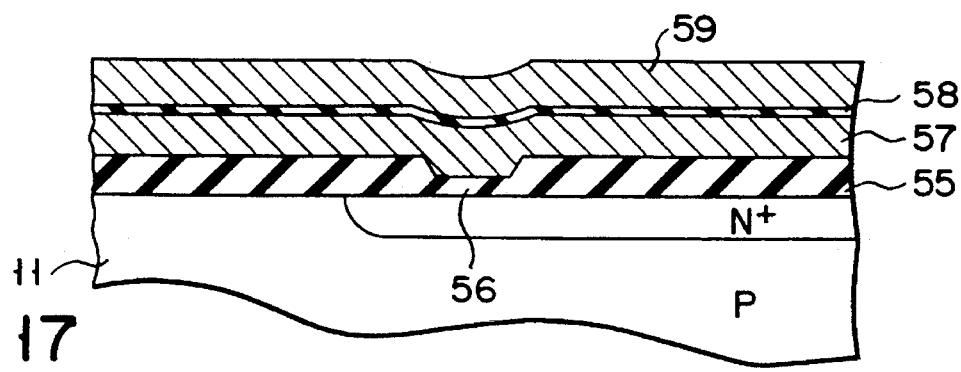
F I G. 17

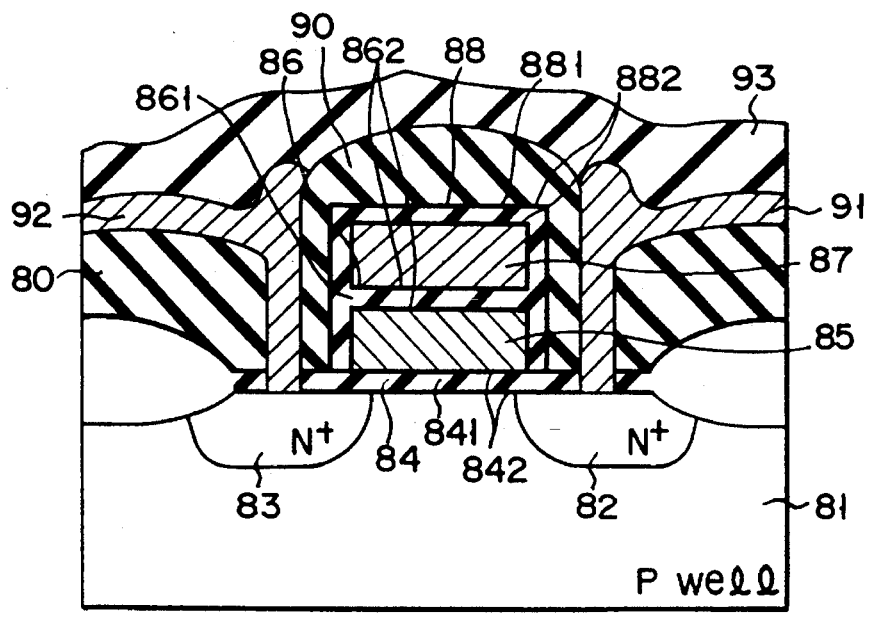
F I G. 20
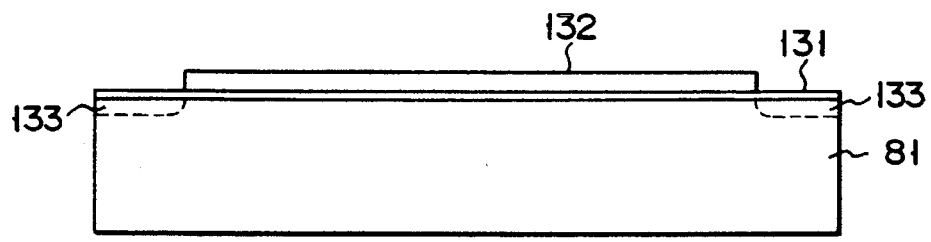
F I G. 21A
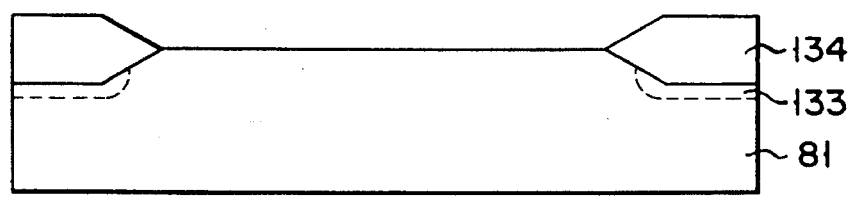
F I G. 21B
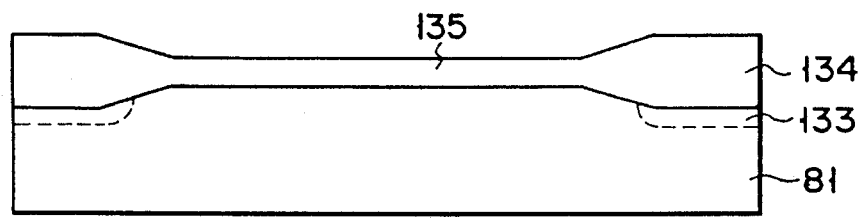
F I G. 21C

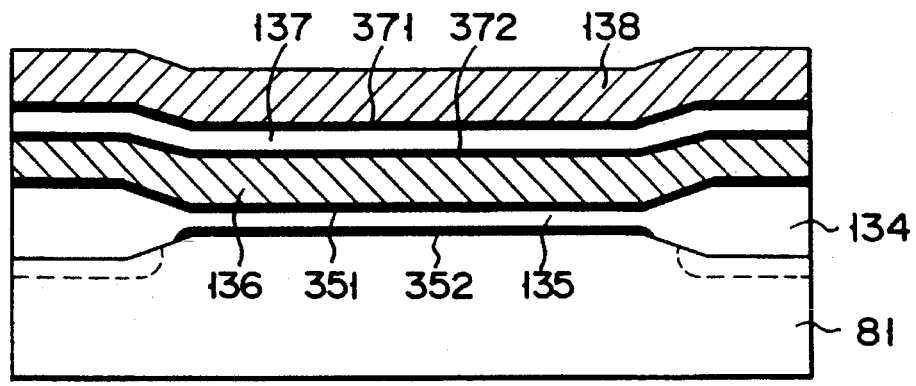
F I G. 21H
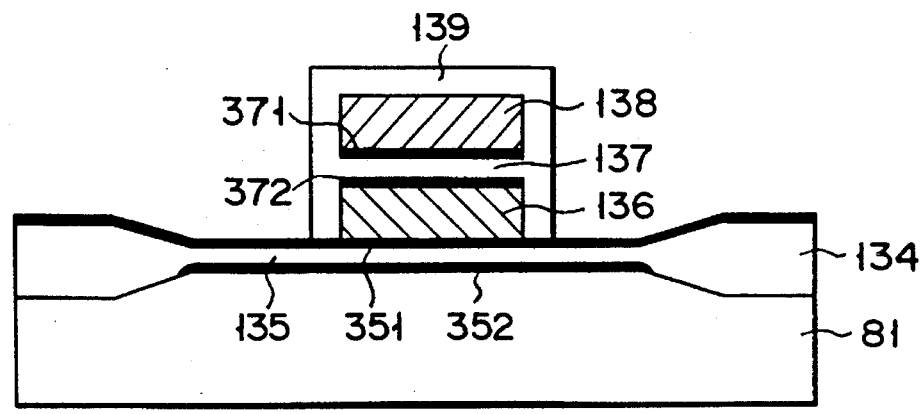
F I G. 21I
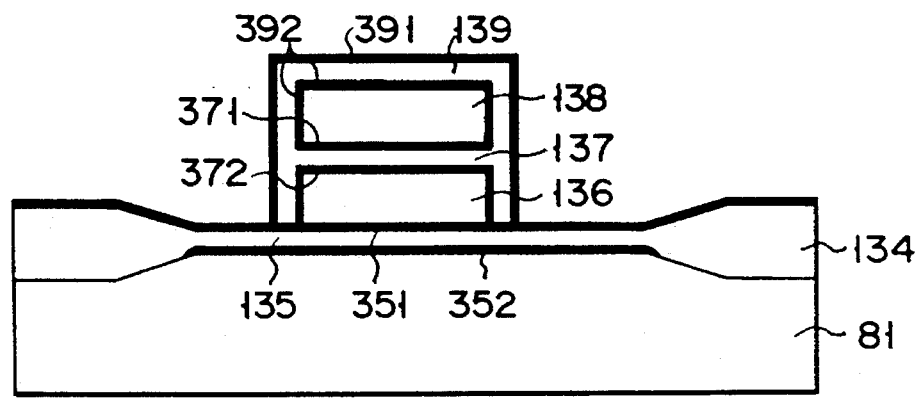
F I G. 21J

METHOD OF MANUFACTURING A FLOATING GATE MEMORY DEVICE

This is a division of application Ser. No. 07/344,605, filed Apr. 28, 1989, now U.S. Pat. No. 5,017,979.

BACKGROUND OF THE INVENTION

1. Field of the Invention

The present invention relates to a semiconductor memory device and a method of manufacturing the same and, more particularly, to a semiconductor memory device of a so-called FLOTOX (Floating Gate Tunnel Oxide) type having a structure in which a tunnel region having a thin insulating film is locally formed between the drain and floating gate of a memory transistor and a method of manufacturing the same.

2. Description of the Related Art

In a semiconductor memory device, e.g., an $E^2$PROM, an insulating film consisting of a silicon oxide film is formed on a surface of a silicon semiconductor substrate, and a thin film portion is locally formed as a tunnel oxide film on the insulating film. A floating gate is formed on this thin tunnel oxide film. In addition, a control gate is formed on the floating gate through a silicon oxide film serving as an insulating film.

In a semiconductor memory device arranged into such a FLOTOX type device, demands have arisen for an improvement in endurance (the number of times of writing and erasing) characteristics and in breakdown characteristics of a tunnel insulating film. For example, U.S. Pat. No. 4,490,900 discloses a means to improve such characteristics, i.e., discloses a technique of forming a three-layer structure consisting of a tunnel oxide film, a nitride oxide film, and an oxide film.

After experiments with an FLOTOX type $E^2$PROM having the above-described structure and examination of the results, the present inventors obtained the following conclusion. A tunnel oxide film generally has a thickness as small as 50 to 150 Å. For this reason, if the concentration of an impurity, e.g., phosphorus, of a floating gate on the tunnel oxide film is excessively high, phosphorus is introduced into the tunnel insulating film. It was found, therefore, that the withstand voltage of the tunnel insulating film with respect to electron injection was lowered, and the number of times of rewriting was reduced due to breakdown of the tunnel insulating film. In addition, variations in rewriting amount occurred.

In contrast to this, if the concentration of phosphorus of the floating gate is decreased, introduction of the impurity into the tunnel insulating film is suppressed, and the above problem may be solved. However, in the above-described conventional technique, the impurity concentration of the floating gate is not designed to be low, but is set to be high instead due to the following reasons.

In $E^2$PROMs, a polyoxide film obtained by oxidizing a floating gate is generally used as an insulating film between the floating gate and a control gate. If the phosphorus concentration of the floating gate is low when it is oxidized, the asperity of a surface of the floating gate upon oxidation is increased. In addition, a polyoxide film at an edge portion of the floating gate is made thinner, and the edge portion is made further acute, thereby decreasing a withstand voltage between the floating gate and the control gate. The edge portion is especially susceptible to such influences, and hence a high voltage for rewriting the $E^2$PROM cannot be applied.

In addition, if an oxidation temperature for forming a polyoxide film on the floating gate is increased, the withstand voltage tends to be increased. However, redistribution of an impurity of the tunnel insulating film in a transistor region occurs, and a problem is posed in terms of a high packing density for microfabrication.

SUMMARY OF THE INVENTION

It is an object of the present invention to provide a semiconductor memory device which can reliably suppress degradation in endurance characteristics, breakdown characteristics of a tunnel insulating film, and the like due to introduction of an impurity into the tunnel insulating film, and a method of manufacturing the same.

It is another object to provide a semiconductor memory device in which the withstand voltage of an oxide film between a floating gate and a control gate is increased without causing redistribution of an impurity in a tunnel insulating film.

It is still another object of the present invention to provide a method of manufacturing a semiconductor memory device wherein an impurity concentration of a floating gate formed in contact with a tunnel insulating film can be locally decreased.

According to a semiconductor memory device of the present invention wherein a tunnel insulating film obtained by setting the thickness of a portion of an insulating film to be small is arranged between a drain and a floating gate of a memory transistor, the impurity concentration of a portion of the floating gate, which is in contact with the tunnel insulating film, is set to be low, and the impurity concentration of portions other than the portion in contact with the tunnel insulating film is set to be higher than that of the low-concentration portion.

Such a semiconductor memory device is manufactured in the following manner. The manufacturing method comprises the steps of forming a first insulating film on a semiconductor substrate at a position corresponding to a tunnel region, forming a second insulating film having a thickness larger than that of the first insulating film so as to be in contact therewith, forming a floating gate in which a portion in contact with the first insulating film has a low impurity concentration, and an impurity concentration of other portions is set to be higher than that of the portion in contact with the first insulating film, and forming a control gate on the floating gate through a third insulating film.

BRIEF DESCRIPTION OF THE DRAWINGS

FIGS. 1A to 1F are sectional views, showing a structure of a semiconductor memory device according to an embodiment of the present invention, for sequentially explaining the steps in manufacturing the same;

FIG. 2 is an equivalent circuit diagram of the semiconductor memory device manufactured in the embodiment shown in FIGS. 1A to 1F;

FIG. 3 is a graph showing a relationship between the oxidation temperature and breakdown voltage in the manufacturing steps in FIGS. 1A to 1F;

FIG. 4 is a graph showing a relationship between the phosphorus concentration and breakdown voltage;

FIG. 5 is a graph showing a relationship between the nitriding time and mobility;

FIG. 6 is a view, showing an arrangement of a chamber, for explaining a means for forming an insulating film in the manufacturing steps in FIGS. 1A to 1F;

FIG. 8 is a graph showing the temperature and pressure in the chamber as a function of time;

FIGS. 12A to 12C are graphs respectively showing relationships between the sputtering time and nitrogen concentration;

FIGS. 14A and 14B are sectional views showing a structure of a semiconductor memory device according to a second embodiment of the present invention in the order of manufacturing steps;

FIGS. 15 to 17 are sectional views for respectively explaining third to fifth embodiments of the present invention;

FIGS. 20 is a sectional view showing a structure of a semiconductor memory device according to an eight embodiment; and FIGS. 21A to 21J are sectional views, showing a structure of the memory device in FIG. 20, for sequentially explaining the steps in manufacturing the same.

DETAILED DESCRIPTION OF THE PREFERRED EMBODIMENTS

Figure 7:
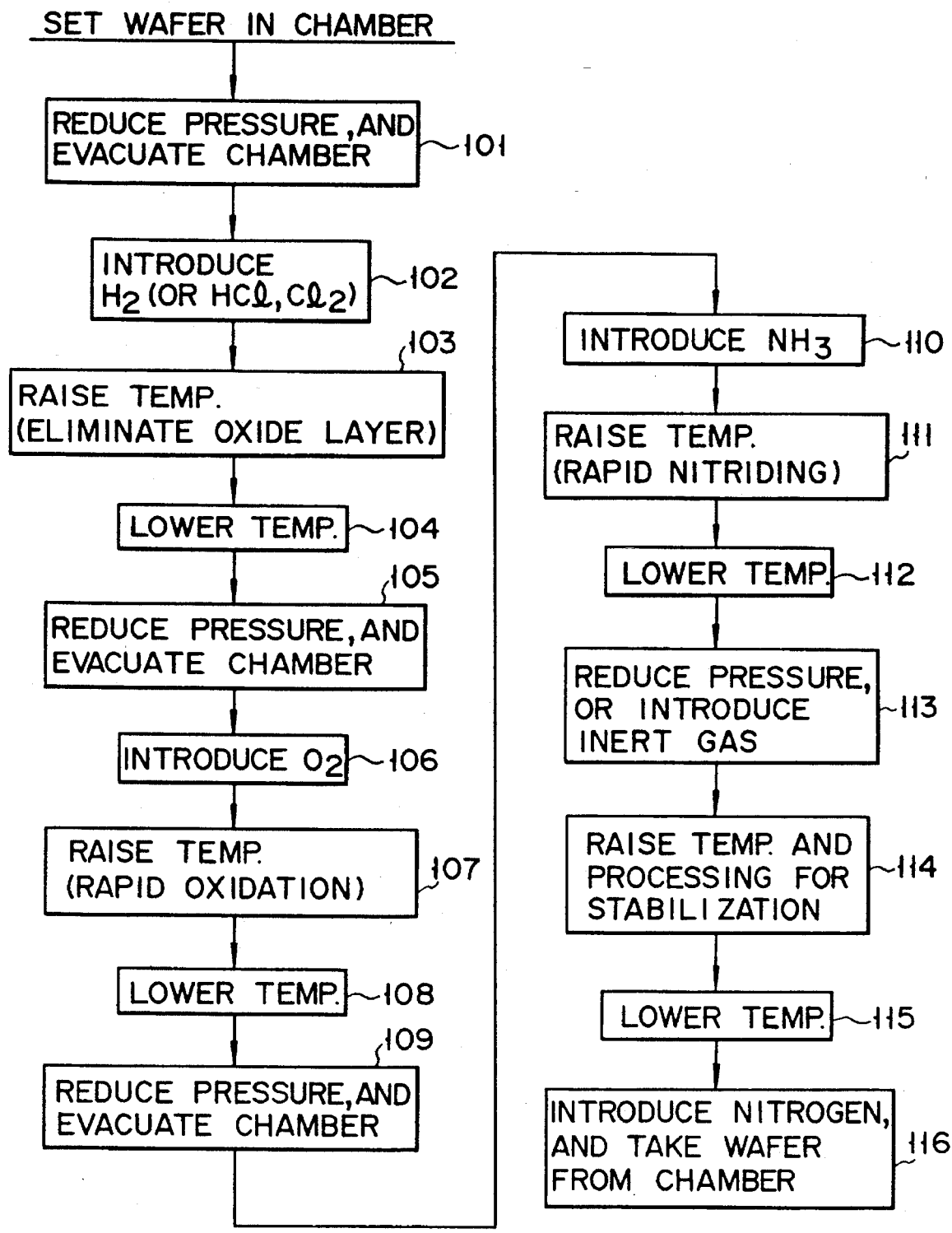
FIG. 7 is a flow chart for explaining the steps in forming the insulating film.

In this embodiment, an FLOTOX type semiconductor memory device will be described in accordance with its manufacturing steps. As shown in FIG. 1A, an element region is formed by field oxide films 12 on the major surface of a semiconductor substrate 11 consisting of a p-type silicon single crystal. An $n^+$-type diffusion region 13 serving as the drain of a memory transistor is formed in this element region. After a thermal oxide film having a thickness of 50 to 150 Å is formed on the surface of the substrate 11, the resultant structure is subjected to a nitriding treatment by lamp heating in an atmosphere of $NH_3$ to form an insulating film 14 having a three layer structure constituted by a nitride oxide film and an oxide film.

After the insulating film 14 is formed in this manner, a first polysilicon film 15 of a thickness of 200 to 4,000 Å is formed on the insulating film 14, as shown in FIG. 1B. An insulating film 16 consisting of $Si_3N_4$ is deposited on the first polysilicon film 15 to a thickness of 200 to 1,000 A by LPCVD (Low-Pressure Chemical Vapor Deposition). Thereafter, the insulating film 16 and the first polysilicon film 15 are etched by normal photolithography or etching, e.g., dry etching so as to leave only a region serving as a prospective tunnel region in correspondence with the drain region.

Subsequently, the nitride oxide film 14 is removed by using a hydrofluoric acid wet etchant to expose the surface of the semiconductor substrate 11.

As shown in FIG. 1C, a thermal oxide film ($SiO_3$) 17 having a thickness of, e.g., 300 to 700 A is formed on the resultant structure by using the insulating film 16 as a mask. After the thermal oxide film 17 is formed in this manner, the insulating film 16 above the tunnel region is removed by using hot phosphoric acid, as shown in FIG. 1D, thus exposing the first polysilicon film 15.

Subsequently, as shown in FIG. 1E, a second polysilicon film 18 containing an impurity (e.g., phosphorus and arsenic) at a high concentration is deposited on the resultant structure to a thickness of 1,000 to 4,000 Å so as to be electrically connected to the first polysilicon film 15 on the surface of the semiconductor substrate 11. Thereafter, the second polysilicon film 18 is oxidized to form an insulating film 19. A third polysilicon film 20 is formed on the insulating film 19 by the same process as that for the second polysilicon film 18.

When the first to third polysilicon films 15, 18, and 20 are formed in this manner, the first to third polysilicon films 15, 18, and 20 and the insulating film 19 are selectively removed to form a floating gate 181 consisting of the second polysilicon film 18, which will constitute a memory transistor A together with the first polysilicon film 15. A control gate 201 is then formed by the third polysilicon film 20, and an insulating film 191 is formed between the floating gate 181 and the control gate 201. In correspondence with a selection transistor B region, a gate electrode 182 of the selection transistor B is formed by the second polysilicon film 18.

When the floating gate 181, the control gate 201, and the gate 182 of the selection transistor are formed in this manner, ions are implanted into the semiconductor substrate 11 to form an $n^+$-type source region 21 of the memory transistor A, and an $n^-$-type source region 22 and a drain region 23 of the selection transistor B.

FIG. 2 shows an equivalent circuit of an E²PROM having the above-described arrangement.

According to the E²PROM having such a structure, since the impurity concentration of the first polysilicon film 15 formed in contact with the insulating film 14 serving as a tunnel insulating film is set to be low, introduction of the impurity into the insulating film 14 is suppressed. Therefore, the endurance characteristics and the breakdown characteristics of the tunnel insulating film can be improved.

Since the impurity concentration of the second polysilicon film 18 constituting the floating gate 181 together with the first polysilicon film 15 is set to be high, the surface of the floating gate 181 is made relatively smooth. In addition, a polyoxide film (not shown) can be formed on an edge portion of the floating gate 181 in an excellent state. As a result, the floating gate 181 can be formed by thermal oxidation, and hence the withstand voltage of the insulating film 19 can be increased.

Note that if a portion of the floating gate 181 in contact with the insulating film 19 formed by thermal oxidation upon formation of the second polysilicon film 18 contains an impurity at a high concentration, the withstand voltage can be increased in the same manner as described above.

In this E²PROM, the high impurity concentration range of the floating gate 181 is determined in association with the formation process of the insulating film 19 described with reference to FIG. 1E. If the oxidation temperature is set to be, e.g., 950° to 1,050° C. in consideration of redistribution of the impurity, the impurity concentration is preferably set to be about $4.1 \times 10^{20}$ cm$^{-3}$ or more.

FIG. 3 shows a relationship between an oxidation temperature T and a breakdown voltage V of the insulating film 19 when a positive potential is applied to the control gate 201 consisting of the third polysilicon film in the E²PROM having the arrangement shown in FIG. 1F. Referring to FIG. 3, triangle plots represent the characteristics of a sample obtained by setting the phosphorus concentration of the floating gate 181 to be $2.2 \times 10^{20}$ cm$^{-3}$, whereas circle plots represent the characteristics of a sample obtained by setting the phosphorus concentration to be $4.1 \times 10^{20}$ cm$^{-3}$. In this case, a precipitation temperature of polysilicon is 610° C., and a withstand voltage determination current value is $4 \times 10^6$ A/mm². Generally, a breakdown voltage is set to be 4 MV/cm or more in consideration of rewriting characteristics. The concentration value of $4.1 \times 10^{20}$ cm$^{-3}$ is set on the basis of this breakdown voltage as are reference.

FIG. 4 shows a relationship between a phosphorus concentration Cp and a breakdown voltage V of the floating gate 181 constituted by the second polysilicon film when the insulating film 19 is formed by performing thermal oxidation in an atmosphere of dry $O_2$ at 1,000° C. It is understood from this graph that the breakdown voltage V is increased with an increase in phosphorus concentration.

Note that if the oxidation temperature for the insulating film 19 falls outside the range of 950° to 1,050° C., an impurity concentration in the floating gate 181 constituted by the second polysilicon film is set on the basis of FIGS. 3 and 4.

In addition, as long as the low impurity concentration range of the first polysilicon film 15 is set below the impurity concentration of the second polysilicon film 18 constituting the floating gate 181 set in the above-described manner, a certain effect can be expected. However, the impurity concentration of the floating gate 181 is preferably set to be as low as possible.

Furthermore, in the above-described E²PROM, a tunnel oxide film is constituted by the insulating film 14 constituting a three-layer structure together with a nitride oxide film and an oxide film, as disclosed, e.g., in U.S. Pat. No. 4,490,900. Therefore, electrons moving between the n⁺-type diffusion region 13 and the first polysilicon film 15 through the tunnel insulating film are not easily trapped, and the endurance characteristics and the breakdown characteristics of the E²PROM are further improved.

According to the manufacturing method disclosed in U.S. Pat. No. 4,490,900, when an oxide film serving as a tunnel insulating film is to be nitrided, a portion near a memory transistor, e.g., a gate oxide film of a selection transistor is simultaneously nitrided with the tunnel insulating film. As a result, the mobility of carriers is decreased due to Coulomb scattering which is considered to be caused by stationary charge introduced in the gate oxide film upon this nitriding, thereby posing a problem of decreasing the device speed.

FIG. 5 shows a relationship between a nitriding time (RTN) and a mobility uFE when a 430-Å thick gate oxide film is nitrided in an atmosphere of $NH_3$ at 1,150° C. by using a halogen lamp. As is apparent from FIG. 5, the mobility is decreased as the nitriding time is prolonged.

According to the E²PROM disclosed in this embodiment, a thermal oxide film is nitrided to form the insulating film 14 having a three-layer structure, and the insulating film is then locally removed to form a tunnel insulating film. Therefore, the thermal oxide film 17 is not nitrided, and the above-described problem is not posed.

In this embodiment, the impurity concentration of the first polysilicon film 15 in contact with the insulating film 14 serving as a tunnel insulating film is decreased by the above-described method. In addition to this method, for example, a first polysilicon film 15 containing no impurity is formed, and an impurity is then diffused therein by ion implantation or by using a gaseous impurity source.

In this case, the insulating film 14 has a three-layer structure so that excellent endurance characteristics can be obtained without making the tunnel insulating film especially thin. A method of manufacturing this insulating film will be described below. As shown in FIG. 6, a silicon semiconductor wafer 32 is inserted in a quartz chamber 31. Gas inlet ports 33 and 34 are formed in the chamber 31. $N_2$ is introduced through the inlet port 33, whereas reactive gases such as $NH_3$, $O_2$, $H_2$, and Cl are selectively introduced through the inlet port 34. In addition, an exhaust port 35 is formed in the chamber 31, so that the chamber 31 is selectively evacuated by a vacuum pump (not shown) through the exhaust port 35.

Since a heating mechanism constituted by halogen lamps 36 is arranged around the quartz chamber 31, the semiconductor wafer 32 is rapidly heated by the halogen lamps 36.

Note that the heating temperature in the quartz chamber 31 is monitored so that the halogen lamps 36 are controlled to set the heating temperature to a target value, although a detail of such a mechanism is not shown in FIG. 6. In addition, arc lamps may be used in place of the halogen lamps.

FIG. 7 is a flow chart of a process for forming a tunnel oxide film in a state wherein the semiconductor wafer 32 is set in the quartz chamber 31. The flow advances to step 101 while the wafer is set in the chamber. In this step, the chamber 31 is evacuated. When the chamber 31 is evacuated to a vacuum state, a reactive gas such as $H_2$ or HCl is introduced into the chamber as shown in step 102, and the flow then advances to step 103 of raising the temperature of the chamber.

In this third step, a natural oxide film which is inferior in quality formed on a surface of the semiconductor wafer 32 due to air or by a chemical treatment is removed. For example, in step 103, the wafer 32 is treated at 1,150° C. for 60 seconds. After the removal treatment of such a natural oxide film, the temperature of the chamber 31 is lowered in the fourth step, i.e., step 104.

When the temperature of the chamber 31 is lowered in step 104, the chamber 31 is evacuated in the fifth step, i.e., step 105. $O_2$ is then introduced in the chamber 31 in the sixth step, i.e., step 106.

When the semiconductor wafer 32 in the chamber 31 is set in an oxygen atmosphere in this step, the temperature of the wafer 32 in the chamber 31 is raised in the seventh step, i.e., step 107 so as to rapidly oxidize the surface of the wafer 32, thus forming a silicon oxide film on the surface of the wafer 32. The temperature raising treatment in this step is performed by using the halogen lamps 36 so as to perform especially rapid temperature raise. The silicon oxide film is formed by rapidly oxidizing the surface of the wafer 32.

The temperature raise/oxidation treatment in the seventh step is performed at 1,150° C. so as to form a silicon oxide film having a thickness of 70 to 90 Å.

When the silicon oxide film is formed on the surface of the semiconductor wafer 32 in this manner, the temperature of the wafer 32 is lowered in the eight step, i.e., step 108. In addition, the chamber 31 is evacuated in the ninth step, i.e., step 109.

A nitriding reactive gas $NH_3$ is introduced in the chamber 31 in the 10th step, i.e., step 110. When such a nitriding reactive gas is introduced, the semiconductor wafer 32 is rapidly heated by the rapidly heating means using the halogen lamps 36 in the 11th step, i.e., step 111 so as to rapidly nitride the silicon oxide film. This nitriding step is performed by a heating treatment at 1,150° C. for 10 seconds.

When the nitriding treatment is performed in this manner, the temperature of the chamber 31 is lowered in the 12th step, i.e., step 112. In addition, the chamber 31 is evacuated to about $10^{-3}$ Torr to several tens of Torr or an inert gas such as nitrogen is introduced in the 13th step, i.e., step 113. In the 14th step, i.e., step 114, the semiconductor wafer 32 is rapidly heated up to 900° to 1,200° C. within 30 to 300 seconds by the rapidly heating means constituted by the halogen lamps 36, thereby performing a stabilization treatment. Thereafter, the temperature of the chamber 31 is lowered in the 15th step, i.e., step 115. Nitrogen is then introduced in the chamber 31 in the 16th step, i.e., step 116, and the wafer 32 is taken out from the chamber 31.

FIG. 8 shows states of temperatures and pressure in the chamber 31 in the respective steps of forming the above-described tunnel oxide film. The reference numerals in FIG. 8 respectively correspond to the step numbers in FIG. 7.

In the $E^2PROM$ having the structure shown in FIG. 1F, writing and erasing of data are performed by supplying/extracting electrons in/from the floating gate 181 through the tunnel insulating film 14.

In a data writing operation of supplying electrons in the floating gate 181, for example, a voltage of 18 to 25V is applied to the control gate 201, and the drain, the source, and the substrate 11 are set at 0V. In addition, in a data erasing operation of extracting electrons from the floating gate 181, the control gate 201, the source, and the substrate 11 are set at 0V, and a voltage of 18 to 25V is applied to the drain.

Figure 9:
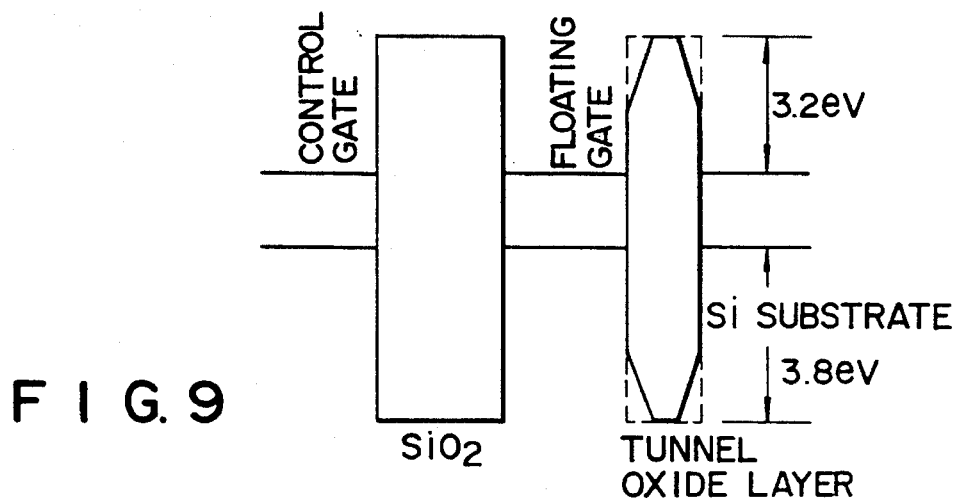
FIG. 9 is a band diagram showing a memory element of a manufactured E²PROM.

The tunnel oxide film formed in this manner has a structure represented by a band diagram shown in FIG. 9, wherein a surface of the tunnel oxide film and an interface side of the silicon substrate are formed into nitrided oxide films. Therefore, as indicated by broken lines in FIG. 9, the barrier heights of tunnel portions at the surface of the tunnel oxide film and the interface portion are made lower than those of a tunnel oxide film consisting of only a silicon oxide ($SiO_2$) film.

As described above, the tunnel insulating film having a three-layer structure in which nitrided oxide films are formed on the upper and lower surfaces of a silicon oxide film can be formed in such a manner that the silicon oxide film formed in the seventh step, i.e., step 107 is rapidly heated by the halogen lamps in an atmosphere of $NH_3$ as in the 10th and 11th steps, i.e., steps 110 and 111.

The above-described nitriding means is described in, e.g., Yasushi Naito et al., J, Vac. Technol, B5(3), May/Jun. 1987, p. 633. When the nitriding time is set to be short, nitrided oxide films are formed on the surface of a silicon oxide film and an interface. With the elapse of time, the entire oxide film becomes nitrided. This phenomenon was confirmed by an experiment performed by the present inventors.

Figure 10:
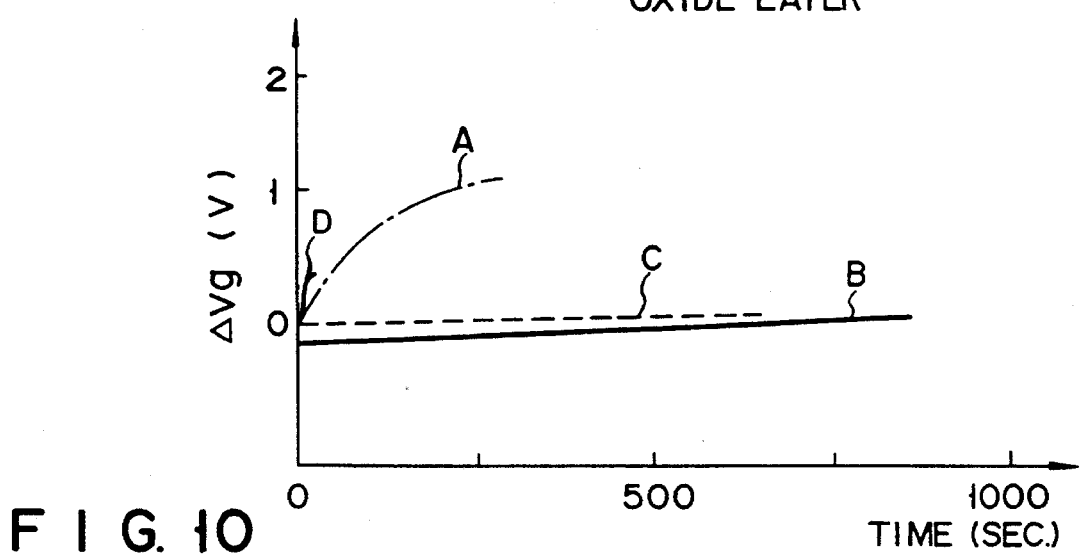
FIG. 10 is a graph showing results obtained by experiments with a trap amount of electrons.

FIG. 10 shows results obtained by the experiment. In this case, a current density J is set as $J=64$ mA/cm$^2$, and a thickness Tox of a tunnel oxide film is set to be 80 Å.

As is apparent from FIG. 10, a curve A represents a case wherein a rapid nitriding time is set to be "0 seconds" and hence no rapid nitriding treatment is performed. In this case, a voltage Vg is increased with the elapse of time. The voltage Vg corresponds to an amount of charge trapped in the tunnel oxide film.

In contrast to this, curves B and C respectively represent cases wherein rapid nitriding is performed at 1,150° C. for 10 seconds and at the same temperature for 30 seconds. In these cases, the voltage Vg undergoes almost no change. However, as indicated by a curve D, if a rapid nitriding treatment is performed for 100 seconds, the voltage Vg is rapidly increased.

If nitrided oxide films are formed on the upper and lower surfaces of a silicon oxide film to form a three-layer structure, the resultant structure is kept in a state wherein a trap amount of electrons is small. In this case, since a drop in threshold voltage in the endurance characteristics is small, even if the number of times of writing and erasing data is increased, stability thereof is maintained.

Figure 11:
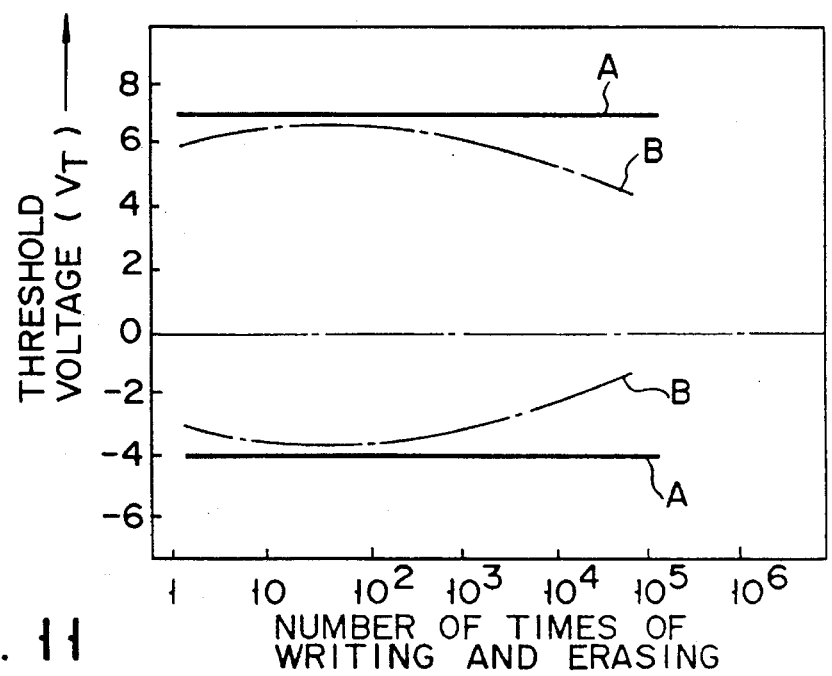
FIG. 11 is a graph showing a comparison between the endurance characteristics of a semiconductor memory device manufactured according to the steps in FIGS. 1A to 1F and those of a conventional device.

FIG. 11 shows endurance characteristics. Referring to FIG. 11, a curve A represents a case wherein a tunnel oxide film has a thickness of 100 Å, and is rapidly nitrided at 1,150° C. for 30 seconds. In this case, a threshold voltage $V_T$ exhibits almost no decrease upon repetition of writing and erasing operations. In contrast to this, when no nitride oxide layer is present, the threshold voltage $V_T$ is lowered and a $V_T$ window is narrowed upon repetition of writing and erasing operations, as indicated by a curve B. Therefore, it is clear that variations in threshold voltage $V_T$ can be suppressed by performing rapid nitriding.

By forming a three-layer structure wherein nitrided oxide layers are formed on the upper and lower surfaces of a tunnel oxide film in this manner, endurance characteristics and breakdown characteristics can be improved. As described in the 13th and 14th steps, i.e., steps 113 and 114, since the heat treatment is performed after the rapid nitriding treatment in the 21st step, the above characteristics can be further improved.

After the rapid nitriding in the 11th step, i.e., step 111, nonreacted $NH_x$, hydrogen, $H_yO$ compounds, and the like are left in the tunnel oxide film. If these residues are contained in the film, breakdown time may be undesirably shortened due to electron trap. As described in the embodiment, however, by performing a heat treatment, the above-described nonreacted residues can be effectively eliminated, as shown in FIGS. 12A to 12C.

Figure 12C:
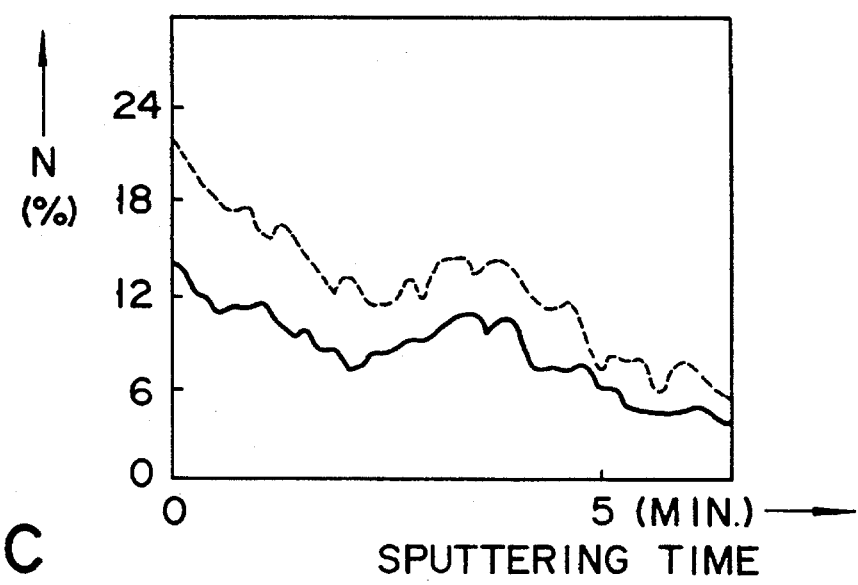

FIGS. 12A to 12C respectively show results obtained by measuring the nitrogen concentration of each tunnel oxide film in its depth direction by Auger analysis. FIG. 12A shows the characteristics of a sample obtained by setting the nitriding temperature in the 11th step, i.e., step 111 to be 1,050° C. FIG. 12B shows the characteristics of a sample obtained by setting the temperature at 1,150° C. FIG. 12C shows the characteristics of a sample obtained by setting the temperature at 1,250° C. In these drawings, broken curves are associated with samples without a heat treatment, whereas solid curves represent the characteristics of samples subjected to the heat treatments.

Note that this experiment was performed such that a heat treatment was performed at 1,000° C. for 10 minutes by using an electric furnace.

As is apparent from the results of this experiment, the nitrogen concentration of each sample subjected to the heat treatment becomes low compared with the samples without a heat treatment. This tendency becomes conspicuous with an increase in nitriding temperature. In this case, the hydrogen concentration of each film cannot be measured because a hydrogen atom is too light. However, as is apparent from the characteristics shown in FIGS. 12A to 12C, since nitrogen is removed, it can be determined that hydrogen atoms which are smaller than nitrogen atoms are more effectively removed.

Since nonreacted residues in a tunnel oxide film can be eliminated by a heat treatment in this manner, an electron trap amount can be effectively reduced. Hence, excellent characteristics of the E$^2$PROM can be obtained.

Note that nonreacted residues can be more satisfactorily eliminated by the step of evacuation than by the step of introduction of an inert gas in the 13th step, i.e., step 113, and hence the step of evacuation is preferable.

As described above, a silicon oxide film is rapidly nitrided to form nitrided oxide layers on the upper and lower surfaces of the oxide film, thereby forming a tunnel oxide film having a three-layer structure. In this case, the endurance characteristics and the breakdown characteristics can be improved. Such an improvement is considered to be based on the following reasons.

If a tunnel oxide film portion is constituted by only a silicon oxide film, distorted strain bonds are present near the interface between a silicon substrate and an SiO$_2$ film constituting the above tunnel oxide film to cause so-called Si-O trapping. However, it is considered that if rapid nitriding is performed, and a certain amount of nitrooxide is formed near the interface, distortion of the interface is reduced, and trapping is suppressed. In addition, the barrier height of this nitrided oxide film is smaller than that of the oxide film. Although the overall tunnel film is thick, its apparent thickness is considered to be small. It is considered, therefore, that trapping is further suppressed.

If, however, the entire oxide film was formed into a nitrided oxide film, it was found that the distortion was increased, the trap amount was considerably increased, and therefore, an optimal range was present.

Figure 13:
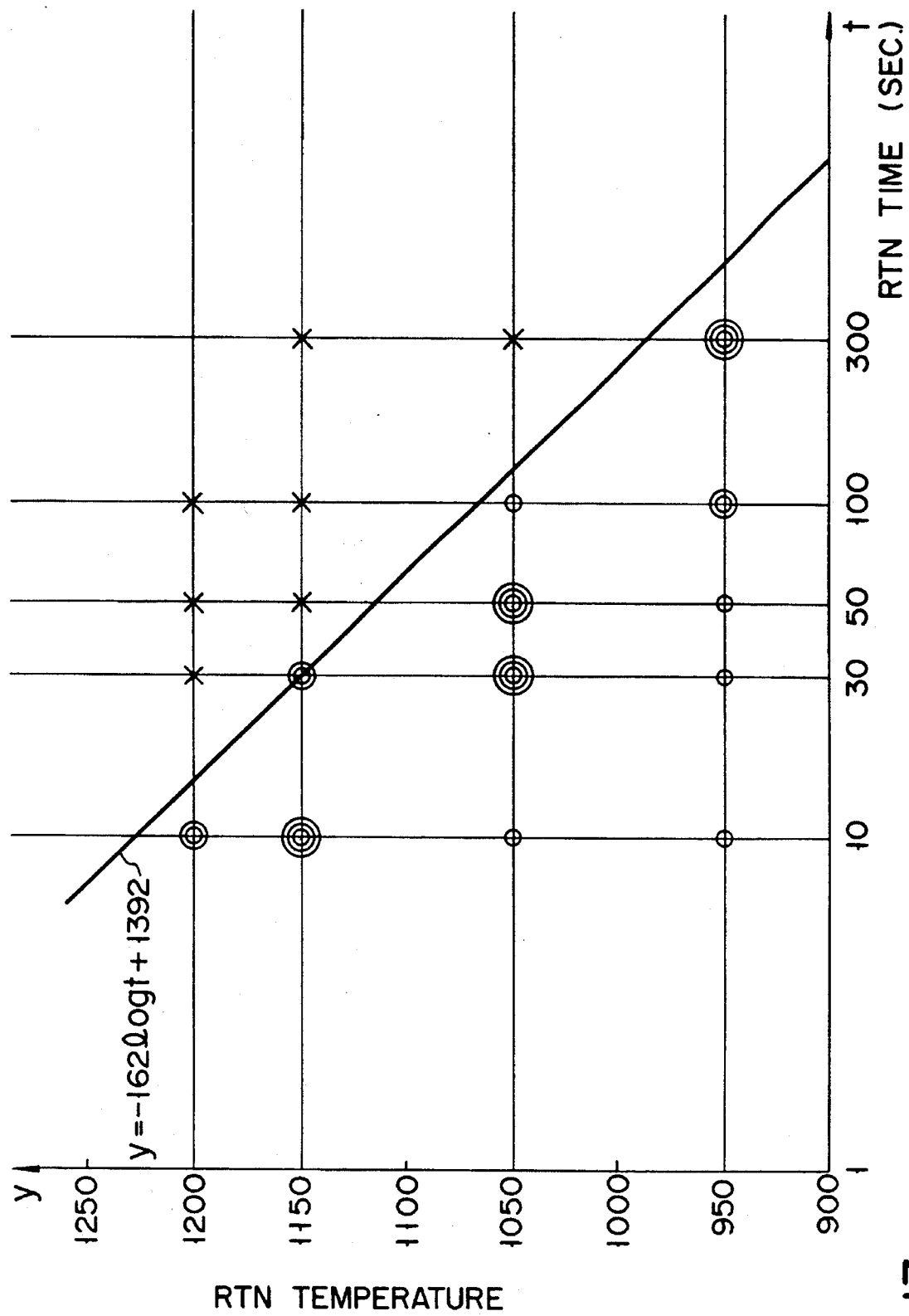
FIG. 13 is a graph for explaining conditions of the nitriding temperature and the rapid nitriding time, which are used to obtain a good three-layer structure.

FIG. 13 shows data based on an experiment, which represents a relationship between a nitriding (RTN) temperature y and a rapid nitriding (RTN) time t. In this experiment, a 4140B parameter analyzer available from Yokogawa Hewlett-Packard Co. was used to measure TDDB breakdown time by applying a positive potential to a gate at a room temperature so as to cause a current to flow at the current density J=64 mA/cm$^2$. Note that the tunnel oxide films of samples used in this experiment had thicknesses of 80±10 Å, and these tunnel oxide films were subjected to the heat treatments in the 13th and 14th steps, i.e., steps 113 and 114.

Assume that an average breakdown time of samples having tunnel oxide films which are not nitrided is set to be "1". Referring to FIG. 13, a line plot represents samples having breakdown time smaller than 1; single circle plots, samples having breakdown time larger than 1; double circle plots, samples having breakdown time larger than 2 (double breakdown time); and triple circle plots, samples having breakdown time larger than 3.

As is apparent from this experiment, within the range substantially satisfying the following relationship:

$$y \leq -162 \log t + 1392$$

the breakdown time of a sample can be prolonged and its characteristics can be improved compared with a sample formed without nitriding a tunnel oxide film.

FIGS. 14A and 14B respectively show sectional structures of a semiconductor memory device according to another embodiment of the present invention. A step of forming a floating gate will be mainly described with reference to these drawings. Other steps are known, and the steps described in the first embodiment will be used as needed.

As shown in FIG. 14A, after a gate insulating film 40 and a tunnel insulating film 41 are formed on a semiconductor substrate 11, a polysilicon film 42 which contains phosphorus at a low concentration or does not contain any impurity is formed. Oxygen and nitrogen ions are locally implanted into the polysilicon film 42 so as to cover a region above the tunnel insulating film 41. The resultant structure is then subjected to a heat treatment so that a barrier layer 43 for impurity diffusion is formed in the polysilicon film 42.

Subsequently, as shown in FIG. 14B, phosphorus is diffused in the polysilicon film 42 at a high concentration from a gaseous impurity source of POCl$_3$ so as to form a region 421 near the tunnel insulating film 41 into a low-concentration impurity region.

FIG. 15 shows an embodiment wherein after a polysilicon film 45 is formed on a semiconductor substrate 11, an SiO$_2$ film or an Si$_3$N$_4$ film 46 is formed above a tunnel insulating film 47.

Subsequently, a second polysilicon film 48 is formed on the resultant structure, and phosphorus is diffused in the same manner as in the embodiment shown in FIGS. 14A and 14B.

FIG. 16 shows an embodiment wherein a gate insulating film 50 is formed on a semiconductor substrate 11, and a tunnel insulating film 51 is locally formed in the film 50. Thereafter, a polysilicon film 52 is formed on the polysilicon film 51. A film 53 such as an SiO$_2$ or Si$_3$N$_4$ film is locally formed on the polysilicon film 52 at a position above the tunnel insulating film 51. If phosphorus is then diffused at a high concentration in the same manner as in the above-described embodiment, a region 54 below the film 53 selectively has a low impurity concentration.

According to this embodiment, a low-concentration region is formed in a flat portion on the polysilicon film 52, whereas an edge portion has a high concentration. In addition, the manufacturing process can be simplified, and hence this embodiment is advantageous in terms of cost.

FIG. 17 shows an embodiment wherein a tunnel insulating film 56 is locally formed in a gate insulating film 55 formed on a semiconductor substrate 11. A first polysilicon film 57 having an impurity at a low concentration is formed on the gate insulating film 55. An oxide film 58 having a thickness of 5 to 20 Å is formed on the first polysilicon film 57. In this case, a natural oxide film or an oxide film formed when the structure is boiled in a solution of H$_2$O$_2$-H$_2$SO$_4$ may be used. A second polysilicon film 59 having an impurity at a high concentration is formed on the oxide film 58. In this case, the impurity from the second polysilicon film 59 is not easily diffused into the first polysilicon film 57 because of the oxide film 58.

Note that since the thickness of the oxide film 58 is satisfactorily reduced, electrons can directly tunnel, and little problem is posed.

Figure 18A:
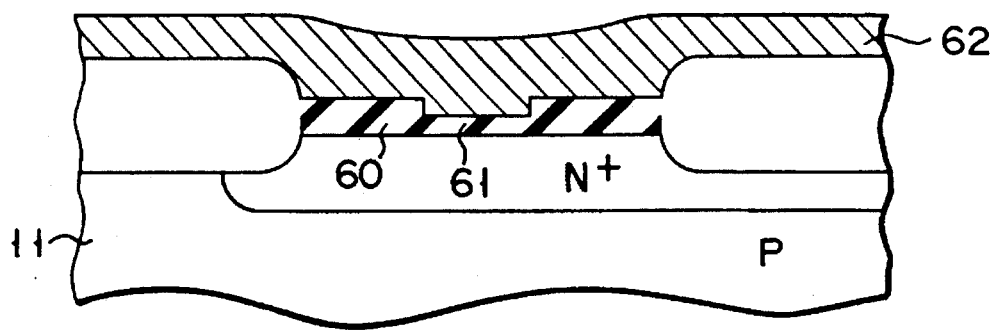
FIGS. 18A to 18D are sectional views sequentially showing the manufacturing steps according to a sixth embodiment.

FIGS. 18A to 18D show manufacturing steps of a semiconductor memory device according to still another embodiment of the present invention. As shown in FIG. 18A, a tunnel insulating film 61 is locally formed in a gate insulating film 60 formed on a semiconductor substrate 11. A non-doped polysilicon film 62 is formed on this gate insulating film 60. Thereafter, phosphorus is diffused from an impurity source of POCl$_3$ into the entire surface of the film 62 at 900° to 1,000° C., or phosphorus or arsenic is ion-implanted to set a low impurity concentration.

Figure 18B:
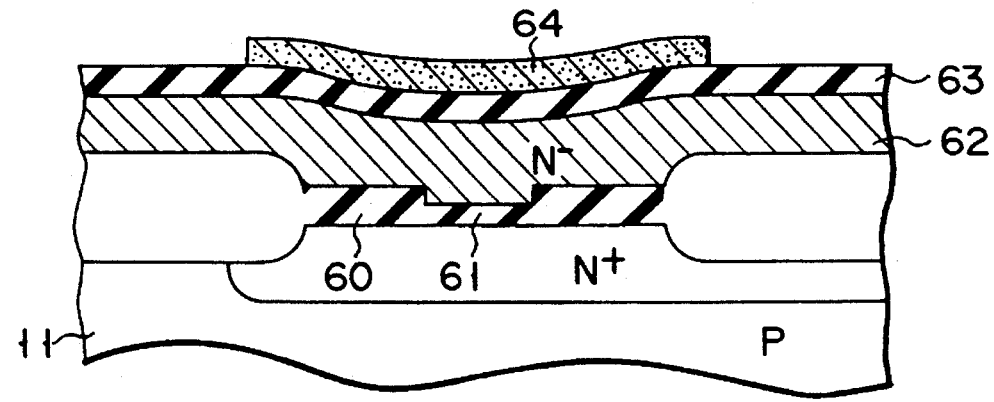
Figure 18C:
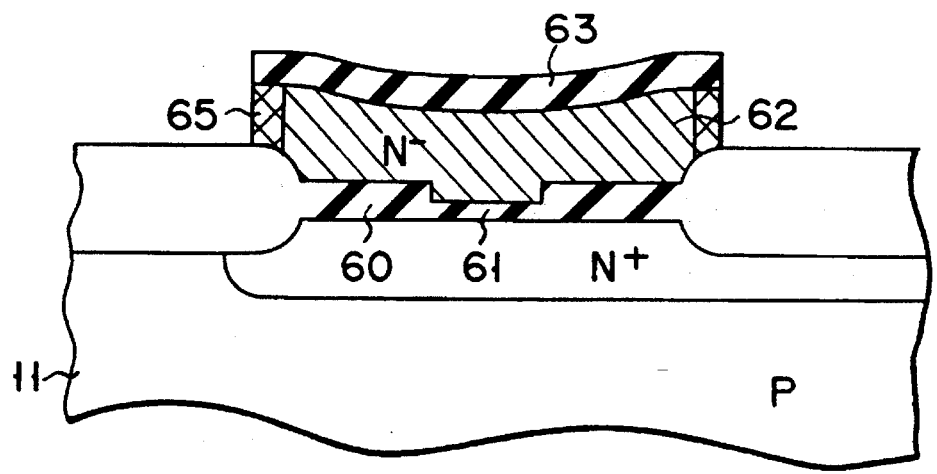
Figure 18D:
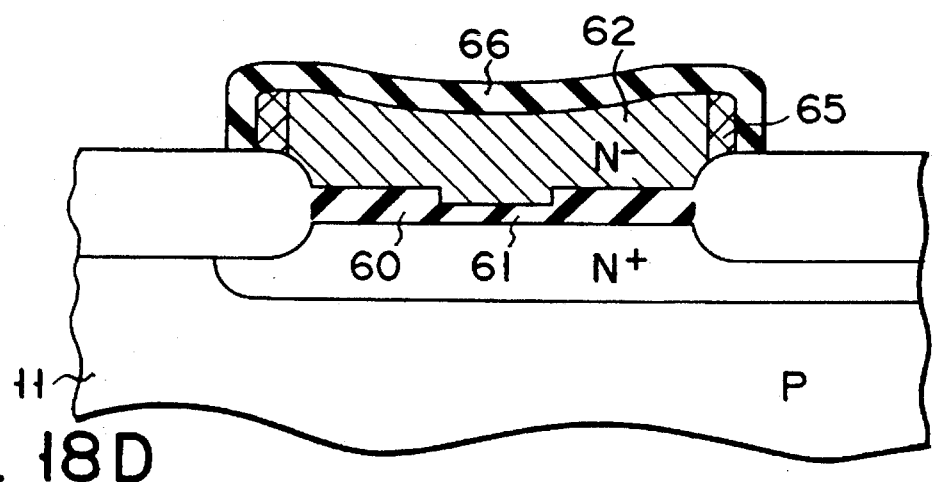

As shown in FIG. 18B, an SiO$_2$ or Si$_3$N$_4$ film 63 having a thickness of 500 to 1,000 Å is formed on the polysilicon film 62 by CVD or thermal oxidation. Subsequently, a resist film 64 is locally formed at a portion above a prospective floating region. As shown in FIG. 18C, the polysilicon film 62 and the $SiO_2$ film 63 are selectively removed by using the resist film 64 as a mask. Thereafter, an impurity is diffused in the resultant structure at a high concentration at 900° to 1,000° C. by using $POCl_3$ or the like as an impurity source, thereby forming a high-concentration region 65. After the $SiO_2$ or $Si3N_4$ film 63 is removed once, an insulating interlayer 66 having a thickness of 400 to 1,000 Å is formed, as shown in FIG. 18D.

Note that gate oxide films of other elements such as MOS elements are simultaneously formed at this time.

According to this embodiment, the endurance characteristics and the breakdown characteristics of the tunnel insulating film can be improved, and moreover, manufacturing steps of a normal $E^2PROM$ can be utilized without using a specific mask.

Figure 19A:
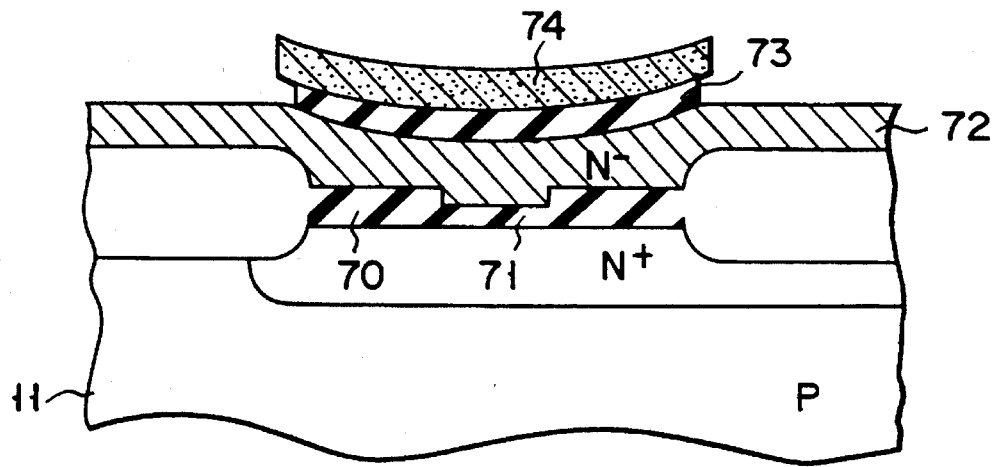
FIGS. 19A and 19B are sectional views for explaining a seventh embodiment of the present invention.
Figure 19B:
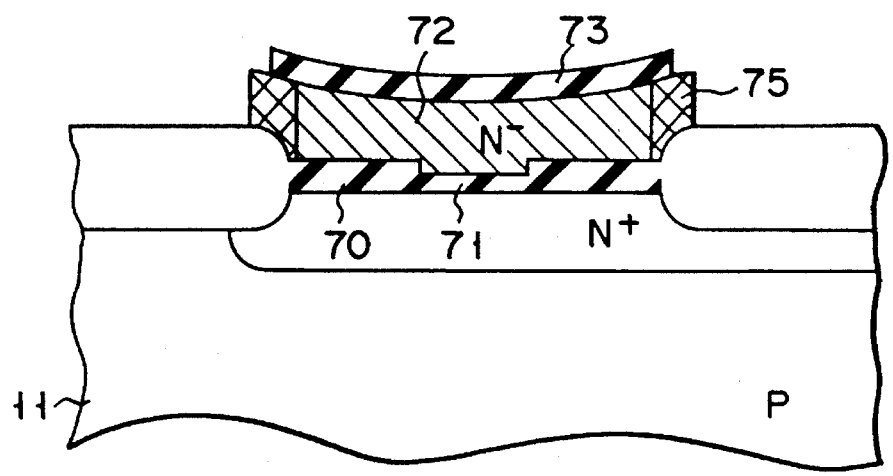

FIGS. 19A and 19B show an embodiment wherein the steps described in the above embodiment with reference to FIGS. 18B and 18C are modified, and other steps are the same as those thereof.

More specifically, as shown in FIG. 19A, a gate insulating film 70 is formed on a surface of a semiconductor substrate 11, and a tunnel insulating film 71 is locally formed in the film 70. In addition, a polysilicon film 72 is formed on the gate insulating film 70. Thereafter, an $SiO_2$ film 73 is formed on the polysilicon film 72. The $SiO_2$ film 73 is wet-etched by a hydrofluoric acid etchant and using a resist film 74 as a mask or overetched by isotropic dry etching. As shown in FIG. 19B, the polysilicon film 72 is then selectively removed. Thereafter, an impurity is introduced at a high concentration into the polysilicon film 72 by using the $SiO_2$ film 73 as a mask, thus forming a high-concentration region 75.

In this embodiment, since the $SiO_2$ film is overetched, the impurity can be easily introduced into the polysilicon film 72.

FIG. 20 shows a sectional structure of a semiconductor memory device according to still another embodiment of the present invention. A drain region 82 and a source region 83 are locally formed in P well region of a semiconductor substrate 81 consisting of silicon. A floating gate 85 consisting of polysilicon is formed on a surface of the semiconductor substrate 81 through an insulating layer 84 serving as a tunnel oxide film. A control gate 87 consisting of polysilicon is formed on the floating gate 85 through an insulating layer 86. An insulating layer 88 is formed on the resultant structure so as to surround the floating gate 85 and the control gate 87.

In this case, the insulating films 84, 86, and 88 are mainly constituted by oxide films 841, 861, and 881, respectively, each of which consists of silicon oxide ($SiO_2$) obtained by a heat treatment in an oxygen atmosphere. Nitrided oxide layers 842, 862, and 882 are respectively formed on the upper and lower surfaces of the silicon oxide films 841, 861, and 881. In this manner, these insulating layers 84, 86, and 88 are formed into three-layer structures.

A BPSG layer 90 is formed on the semiconductor substrate 81 so as to cover the floating gate 85 and the control gate 87. Aluminum wiring layers 91 and 92 respectively extend from the drain region 82 and source region 83 through the BPSG layer 90. Reference numeral 93 denotes a protective passivation film.

Figure 21D:
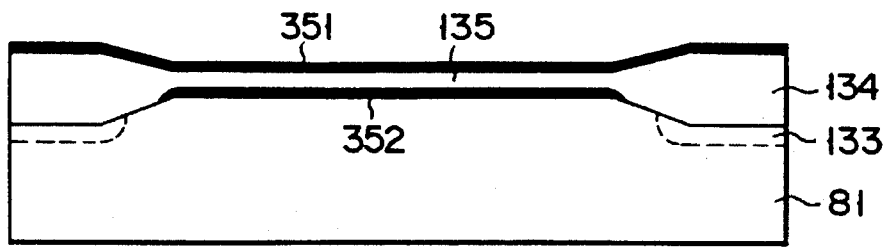
Figure 21E:
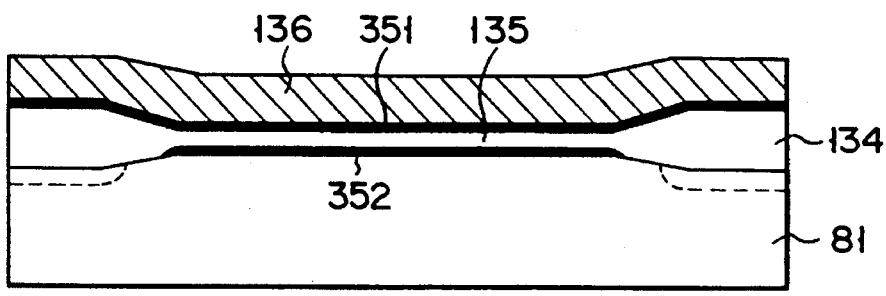

FIGS. 21A to 21J sequentially show manufacturing steps of a semiconductor memory device such as described above, more specifically, a memory cell portion of an EPROM. As shown in FIG. 21A, a field oxide film region is formed in a P well formation region of a semiconductor substrate 81 consisting of silicon by a LOCOS method. An oxide film 131 consisting of $SiO_2$ and having a thickness of 200 to 500 Å is formed on the substrate 81. A silicon nitride ($Si_3N_4$) layer 132 having a thickness of 1,000 to 2,000 Å is formed on the oxide film 131 and is then formed into a pattern shape by photolithography or etching. Boron ions are implanted into the substrate 81 by using the silicon nitride layer 132 as a mask to form a $p^+$-channel stopper region 133. Thereafter, a field oxide film 134 having a thickness of 0.5 to 1.5 µm is formed in steam of 1,000° C., as shown in FIG. 21B.

The oxide film 131 and the silicon nitride layer 132 are removed in this state. Thereafter, a gate 135 consisting of a silicon oxide film having a thickness of 200 to 500 Å is formed, as shown in FIG. 21C.

When the gate oxide film 135 is formed in this manner, the semiconductor substrate 81 is set in an atmosphere of a nitrogen gas and rapidly heated to form nitrided oxide layers 351 and 352 respectively on the upper and lower surfaces of the gate oxide film 135, as shown in FIG. 21D. These nitrided oxide layers are formed in the same manner as in the method described with reference to FIG. 7.

Figure 21F:
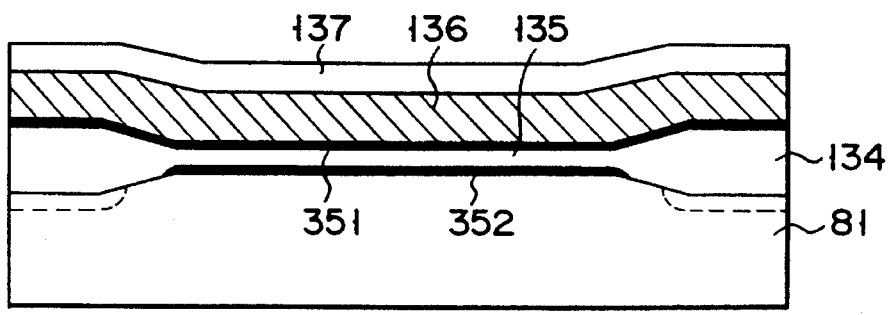
Figure 21G:
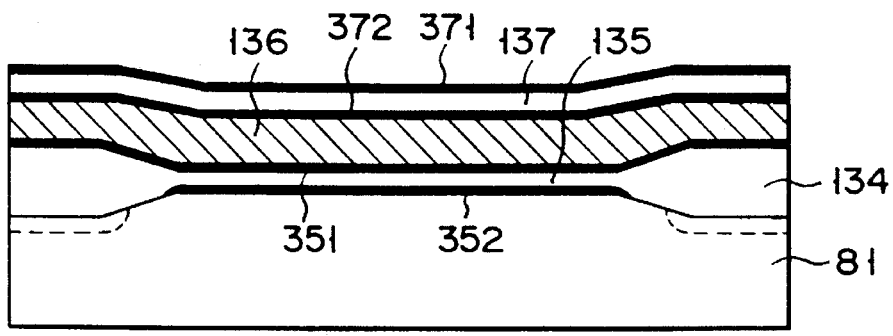

When the gate oxide film 135 having a three-layer structure is formed in this manner, a first $n^+$-type polysilicon layer 136 having a thickness of 3,000 to 5,000 Å is formed on the resultant structure. In addition, an oxide film layer 137 is formed on the polysilicon layer 136 by thermal oxidation, as shown in FIG. 21F. This oxide film layer 137 is subjected to a rapid nitriding treatment as in the case of the gate oxide film 135 to form nitrided oxide layers 371 and 372 on the upper and lower surfaces of the oxide film layer 137, as shown in FIG. 21G.

When the oxide film layer 137 having the nitrided oxide layers on its upper and lower surfaces is formed in this manner, a second polysilicon layer 138 having a thickness of 3,000 to 5,000 Å is formed on the layer 137, as shown in FIG. 21H. In this state, parts of the second polysilicon layer 138, the oxide film layer 137, and the first polysilicon layer 136 are removed by etching. As a result, a floating gate and a control gate of, e.g., an EPROM are constituted by the first and second polysilicon layers 136 and 138 upon partial removal thereof.

Subsequently, as shown in FIG. 21I, a thermal oxide film 139 is formed on peripheral portions of the gates. Nitrided oxide layers 391 and 392 are then formed on the upper and lower surfaces of the thermal oxide film 139 by a rapid nitriding treatment in the same manner as described above, as shown in FIG. 21I. A source, a drain, a BPSG insulating interlayer, and aluminum wiring layers are formed on the resultant structure, thereby completing the semiconductor memory device shown in FIG. 20.

Although the impurity concentration of the first polysilicon layer 136 serving as a floating gate is not specifically described in the above manufacturing steps, it is set to be lower than that of the second polysilicon layer 138.

What is claimed is:

1. A method of manufacturing a semiconductor memory device, comprising:

a first step of forming a first insulating film at a position corresponding to a tunnel region on a surface of a semiconductor substrate, and forming a second insulating film having a thickness larger than that of said first insulating film on portions other than said tunnel region so as to be in contact with said first insulating film, said first and second insulating films constituting a gate insulating film;

a second step of forming a floating gate on said gate insulating film including a portion on said tunnel region, said floating gate being comprised of a first conductive layer in contact with said gate insulating film and a second conductive layer formed on said first conductive layer, an impurity concentration of said first conductive layer being set to be lower than that of said second conductive layer; and a third step of forming a third insulating film between said first and second conductive layers constituting said floating gate, said third insulating film being formed to prevent diffusion of impurity from said second conductive layer to said first insulating layer and having a thickness which enable movement of carriers between the first and second conductive layers.

2. A method of manufacturing a semiconductor memory device, comprising:

a first step of forming a first insulating film at a position corresponding to a tunnel region, on a surface of a semiconductor substrate, and forming a second insulating film having a thickness larger than that of said first insulating film on portions other than said tunnel region so as to be in contact with said first insulating film, said first and second insulating films constituting a gate insulating film;

a second step of forming a first conductive film having a low impurity concentration on said gate insulating film, said first conductive film constituting a floating gate;

a third step of forming a barrier layer on said first conductive film at least in a region broader than that of said first insulating film forming said gate insulating film; and a fourth step of diffusing an impurity from a surface of said first conductive film so as to set an impurity concentration of an outer portion of a region corresponding to said barrier layer to be higher than that of an inner portion of said region corresponding to said barrier layer.

3. A method of manufacturing a semiconductor memory device, comprising:

a first step of forming a first insulating film at a position corresponding to a tunnel region on a surface of a semiconductor substrate, and forming a second insulating film having a thickness larger than that of said first insulating film on portions other than said tunnel region so as to be in contact with said first insulating film, said first and second insulating films constituting a gate insulating film;

a second step of forming a floating gate on said gate insulating film including a portion on said tunnel region, wherein the floating gate is formed on said first and second insulating films, then forming a barrier layer in said floating gate at a position corresponding to said tunnel region, and diffusing an impurity into said floating gate to set an impurity concentration of a portion of said floating gate corresponding to said tunnel region, between said first insulating film, and said barrier layer, to be lower than that of other portions; and a third step of forming a control gate on said floating gate through a third insulating film.

4. A method according to claim 1, wherein the second step of forming said floating gate includes the steps of forming a first conductive film having a low impurity concentration so as to be in contact with said first insulating film, etching said first conductive film in accordance with a pattern to form said portion in contact with said first insulating film, and forming a second conductive film having an impurity concentration higher than that of said first conductive layer so as to be in contact therewith.

5. A method according to claim 1, wherein the first step of forming said first insulating film includes the steps of oxidizing a surface of said semiconductor substrate to form an oxide film, and nitriding said oxide film to form a nitrided oxide film.

6. A method according to claim 1, wherein the first step includes the steps of forming a thermal oxide film on said semiconductor substrate, and performing a nitriding treatment in an atmosphere containing a nitrogen gas by rapid heating to form said thermal oxide film into a three-layer structure constituted by a nitrided oxide film and an oxide film.

7. A method according to claim 3, wherein the barrier layer-forming step includes implanting ions into said portion of said conductive layer corresponding to said tunnel region and performing a heat treatment to form a barrier layer against impurity diffusion.

8. A method according to claim 3, wherein the conductive layer-forming and barrier layer-forming steps include the steps of forming a first conductive layer on said first and second insulating layers, forming an insulating film on a portion of said first insulating film corresponding to said tunnel region, and forming a second conductive layer on said insulating film, said floating gate being constituted by said first and second conductive layers, and said barrier layer being constituted by said insulating film.

9. A method according to claim 3, wherein the barrier layer-forming step comprises forming an insulating film on said conductive layer formed in the second step at a position corresponding to said tunnel region.

10. A method according to claim 1, wherein said first conductive layer is formed on said gate insulating film, and in said third step said third insulating film is formed at a region broader than that of a first insulating film corresponding to said tunnel region on said first conductive layer.

11. A method according to claim 1, wherein said first conductive layer is formed on said gate insulating film, and in said third step said third insulating film is formed on said first conductive layer, on which said second conductive layer is formed.

12. A method according to claim 2, wherein said third step includes implanting ions in said first conductive film and performing a heat treatment to diffuse said ions.

13. A method according to claim 2, wherein said third and fourth steps are performed simultaneously.

14. A method according to claim 2, further comprising:

a step of providing an oxide at a section on a surface of said first conductive film.

* * * * *